(12) United States Patent
Oh

(10) Patent No.: US 7,701,792 B2
(45) Date of Patent: Apr. 20, 2010

(54) SENSING MARGIN VARYING CIRCUIT AND METHOD THEREOF

(75) Inventor: Chul-Woong Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 302 days.

(21) Appl. No.: 11/509,592

(22) Filed: Aug. 25, 2006

(65) Prior Publication Data

US 2007/0047358 A1    Mar. 1, 2007

(30) Foreign Application Priority Data

Aug. 26, 2005    (KR) .................. 10-2005-0078905

(51) Int. Cl.
*G11C 7/00* (2006.01)
(52) U.S. Cl. .................. 365/205; 365/207; 365/225.7
(58) Field of Classification Search .............. 365/225.7, 365/205, 207
See application file for complete search history.

(56) References Cited

U.S. PATENT DOCUMENTS

| 5,652,729 | A | * | 7/1997 | Iwata et al. ................. 365/222 |
| 6,005,793 | A | * | 12/1999 | Tran ............................ 365/154 |
| 6,414,892 | B2 | | 7/2002 | Furumochi | |
| 6,438,064 | B2 | * | 8/2002 | Ooishi .................... 365/230.03 |
| 2004/0218438 | A1 | | 11/2004 | Do | |

FOREIGN PATENT DOCUMENTS

| JP | 08-180699 | | 7/1996 |
| JP | 09-069300 | | 3/1997 |
| JP | 2003-173685 | | 6/2003 |
| KR | 1999-0004651 | | 1/1999 |
| KR | 10-1999-0062409 | * | 7/1999 |
| KR | 1999-0051394 | | 7/1999 |
| KR | 1019990051394 | | 7/1999 |
| KR | 10-2002-0012482 | A | 2/2002 |
| KR | 10-0541796 | B1 | 1/2006 |

OTHER PUBLICATIONS

Korean Patent Office Action dated Sep. 28, 2006 and English language translation thereof for corresponding Korean Patent Application No. 10-2005-0078905.
Taiwanese Preliminary Notice of the First Office Action dated Oct. 31, 2008 for Taiwanese Patent Application No. 095131307 and English language translation thereof.

* cited by examiner

*Primary Examiner*—Hoai V Ho
*Assistant Examiner*—Kretelia Graham
(74) *Attorney, Agent, or Firm*—Harness, Dickey & Pierce, P.L.C.

(57) ABSTRACT

A sensing margin varying circuit and method thereof are provided. The example sensing margin varying circuit may control the skew of a ready signal and may include a plurality of semiconductor elements which are connected to a plurality of accelerating transistors positioned on a current path between a node outputting the ready signal and a ground voltage, each of the plurality of accelerating transistors selectively controlled so as to adjust a duration of a logic transition of the ready signal. The example method may control the skew of a ready signal and may include selectively controlling a plurality of accelerating transistors positioned on a current path between a node outputting the ready signal and a ground voltage, each of the plurality of accelerating transistors selectively controlled so as to adjust a duration of a logic transition of the ready signal.

16 Claims, 5 Drawing Sheets

SENSING MARGIN VARYING CIRCUIT AND METHOD THEREOF

PRIORITY STATEMENT

This application claims the benefit of Korean Patent Application No. 10-2005-0078905, filed on Aug. 26, 2005, in the Korean Intellectual Property Office, the disclosure of which is incorporated herein in its entirety by reference.

BACKGROUND OF THE INVENTION

1. Field of the Invention

Example embodiments of the present invention relate generally to a sensing margin varying circuit and method thereof, and more particularly to a sensing margin varying circuit and method of adjusting a skew of a ready signal during a logic transition.

2. Description of the Related Art

Static random access memories (SRAMs) may store data so long as a constant supply of power is supplied thereto. Unlike dynamic random access memories (DRAMS), conventional SRAMs may require a periodic refresh operation. A typical SRAM cell may include a flip-flop storing data and two switches. Data may be read from the SRAM cell using a sense amplifier. The sense amplifier may sense a difference between a bit signal BIT and an inverted bit signal BITB respectively output through the two switches to read data stored in the SRAM cell.

FIG. 1 is a block diagram of a conventional SRAM 100. The conventional SRAM 100 may include an X decoder 101, a wordline driver 103, a dummy column unit 105, a bit cell array 107, a Y Multiplexer 109, a sense amplifier 111, an input/output unit 113, and a controller 115. Conventional operation of reading data stored in a bit cell array 107 of the SRAM 100 will now be described with reference to FIG. 1.

In conventional operation of the SRAM 100 of FIG. 1, if a clock signal CLK, an address signal ADD, an output enable signal OE, and a chip select signal CS are applied to a controller 115, the controller 115 may output a row address signal ADDX and a column address signal ADDY in response to the address signal ADD. Further, the controller 115 may output a data enable signal DEN, a data control signal DCTRL, and a precharge signal PRECHARGE obtained by inverting the data control signal DCTRL and delaying the inverted data control signal by a given period of time in response to the clock signal CLK. A write enable signal WE may also be applied to the controller 115 and the controller 115 may output an input/output enable signal IOEN.

In conventional operation of the SRAM 100 of FIG. 1, a wordline driver 103 may output a wordline signal W/L in response to a row address, which may be output from an X decoder 101 in response to the row address signal ADDX, to enable a wordline of the bit cell array 107 corresponding to the row address. Furthermore, the wordline driver 103 may transmit the data enable signal DEN and the data control signal DCTRL to a dummy column unit 105.

In conventional operation of the SRAM 100 of FIG. 1, the Y multiplexer 109 may bidirectionally connect to the bit cell array 107 and the sense amplifier 111. The Y multiplexer may also receive the column address signal ADDY and the precharge signal PRECHARGE.

In conventional operation of the SRAM 100 of FIG. 1, the input/output unit 113 may bidirectionally connect to the sense amplifier 111. The input/output unit 113 may receive the input/output enable signal from the controller 115 and receive the data input signal DIN and transmit the data output signal DOUT.

In conventional operation of the SRAM 100 of FIG. 1, the dummy column unit 105 may output a ready signal READY in response to the data enable signal DEN and the data control signal DCTRL. The controller 115 may output a sensing enable signal SENSE in response to the ready signal READY.

In conventional operation of the SRAM 100 of FIG. 1, a sense amplifier 111 may sense a difference between a bit signal BIT and an inverted bit signal BITB output from the bit cell array 107 in response to the sensing enable signal SENSE and may read data in response to the sensed difference (e.g., see (b) in FIG. 3).

As described above, the timing of sensing the levels of the bit signal BIT and the inverted bit signal BITB may depend on the time when the sensing enable signal SENSE is applied to the sense amplifier 111. The sensing enable signal SENSE may be generated in response to the ready signal READY (e.g., see (a) in FIG. 3). Accordingly, the timing of sensing the levels of the bit signal BIT and the inverted bit signal BITB may depend on the ready signal READY output from the dummy column unit 105.

FIG. 2 is a block diagram of the dummy column unit 105 of FIG. 1. The dummy column unit 105 may include a switching controller 1051, and pull-up unit 1053, an accelerating unit 1055, a first unit 1057 and a second unit 1059. Referring to FIG. 2, the dummy column unit 105 may output the ready signal READY in response to the data enable signal DEN and the data control signal DCTRL. An initial level of the ready signal READY may be set to a first logic level (e.g., a higher logic level or logic "1") and initial levels of the data enable signal DEN and the data control signal DCTRL may be set to a second logic level (e.g., a lower logic level or logic "0"). Internal terminals FA, FB and DUMCOL of the dummy column unit 105 may be floated. Initial levels of the internal terminals FA and FB may be set to the first logic level (e.g., a higher logic level or logic "1") and the initial level of internal terminal DUMCOL may be set to the second logic level (e.g., a lower logic level or logic "0").

FIG. 3 illustrates a waveform timing diagram during a conventional read operation of the SRAM 100 of FIG. 1. A conventional read operation, performed by the SRAM 100 of FIG. 1, will now be described in greater detail with respect to FIGS. 1 through 3.

Referring to FIGS. 1 through 3, a node A of the dummy column unit 105 may be set to the second logic level (e.g., a lower logic level or logic "0"), and a transistor Q1 may be turned on and accelerating transistors Q2 may be turned off in response to the second logic level of the node A in the initial state. Thus, a node N from which the ready signal READY may be output, may be set to the first logic level (e.g., a higher logic level or logic "1") in the initial state.

Referring to FIGS. 1 through 3, during the conventional read operation, the data enable signal DEN and the data control signal DCTRL may be enabled in response to the clock signal CLK, and the voltage at the node A may transition from the second logic level (e.g., a lower logic level or logic "0") to the first logic level (e.g., a higher logic level or logic "1"). The transistor Q1 may be turned off and the accelerating transistors Q2 may be turned on in response to the first logic level at the node A.

Referring to FIGS. 1 through 3, if the accelerating transistors Q2 are turned on, a current path may be formed from the node N to a ground voltage. Accordingly, current may flow through the accelerating transistors Q2 from the node N to the ground voltage, and, thereby, the ready signal READY may transition from the first logic level (e.g., a higher logic level or logic "1") to the second logic level (e.g., a lower logic level or logic "0").

As shown in FIG. 3, the ready signal READY may transition to the second logic level with a given gradient (e.g., slope or skew). This gradient of the logic transition of the ready signal READY may depend on a driving capability of the accelerating transistors Q2. If the driving capability of the accelerating transistors Q2 is relatively high, current may be rapidly conducted to the ground voltage from the node N, and thus the gradient of the ready signal READY may be relatively high (e.g., the voltage may be "grounded" so as to be reduced very quickly to facilitate the transition from the first logic level to the second logic level). If the driving capability of the accelerating transistors Q2 is relatively low, the gradient of the ready signal READY may likewise be relatively low.

Referring to FIGS. 1 through 3, the wordline signal W/L may be enabled in response to the data control signal DCTRL, and data of the bit cell array 107 corresponding to the wordline W/L may be output as the bit signal BIT and the inverted bit signal BITB.

Referring to FIG. 1, the controller 115 may enable the sensing enable signal SENSE if the ready signal READY is set to the second logic level (e.g., a lower logic level or logic "0"). The sense amplifier 111 may sense the difference between the bit signal BIT and the inverted bit signal BITB in response to the enabled sensing enable signal to read data.

As described above, the difference between the bit signal BIT and the inverted bit signal BITB may be sensed or detected in response to the sensing enable signal SENSE, and the sensing enable signal SENSE may be enabled in response to the ready signal READY. Accordingly, a timing of sensing the difference between the bit signal BIT and the inverted bit signal BITB may depend on the gradient, or duration, of the ready signal READY transitioning from the first logic level to the second logic level. That is, the timing for sensing of the bit signal BIT and the inverted bit signal BITB may be determined at least in part by the driving capability of the accelerating transistors Q2 included in the dummy column unit 105. Thus, the sensing timing may be controlled by adjusting a size or number of the accelerating transistors Q2 arranged in parallel.

Conventional digital devices may be developed with portability and multi-functionality as design factors. Such conventional digital devices may include SRAMs or ROMs, which may ideally be configured for higher speed operation, higher integration and lower power consumption. In particular, a sensing margin corresponding to a period from the output of the bit signal BIT and the inverted bit signal BITB to the sensing of the difference between the bit signal BIT and the inverted bit signal BITB in response to the wordline signal W/L may be a design factor which may affect the read operation of an SRAM. Generally, the sensing margin may be determined when the SRAM or a ROM is debugged (e.g., during a fabrication process) by cutting accelerating transistors. However, if the sensing margin of the SRAM or ROM is determined to be a failure, a repair operation for the failed SRAM or ROM may not be possible with conventional repair methods.

SUMMARY OF THE INVENTION

An example embodiment of the present invention is directed to a sensing margin varying circuit which controls the skew of a ready signal, including a plurality of semiconductor elements which are connected to a plurality of accelerating transistors positioned on a current path between a node outputting the ready signal and a ground voltage, each of the plurality of accelerating transistors selectively controlled so as to adjust a duration of a logic transition of the ready signal.

Another example embodiment of the present invention is directed to a method of controlling the skew of a ready signal, including selectively controlling a plurality of accelerating transistors positioned on a current path between a node outputting the ready signal and a ground voltage, each of the plurality of accelerating transistors selectively controlled so as to adjust a duration of a logic transition of the ready signal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
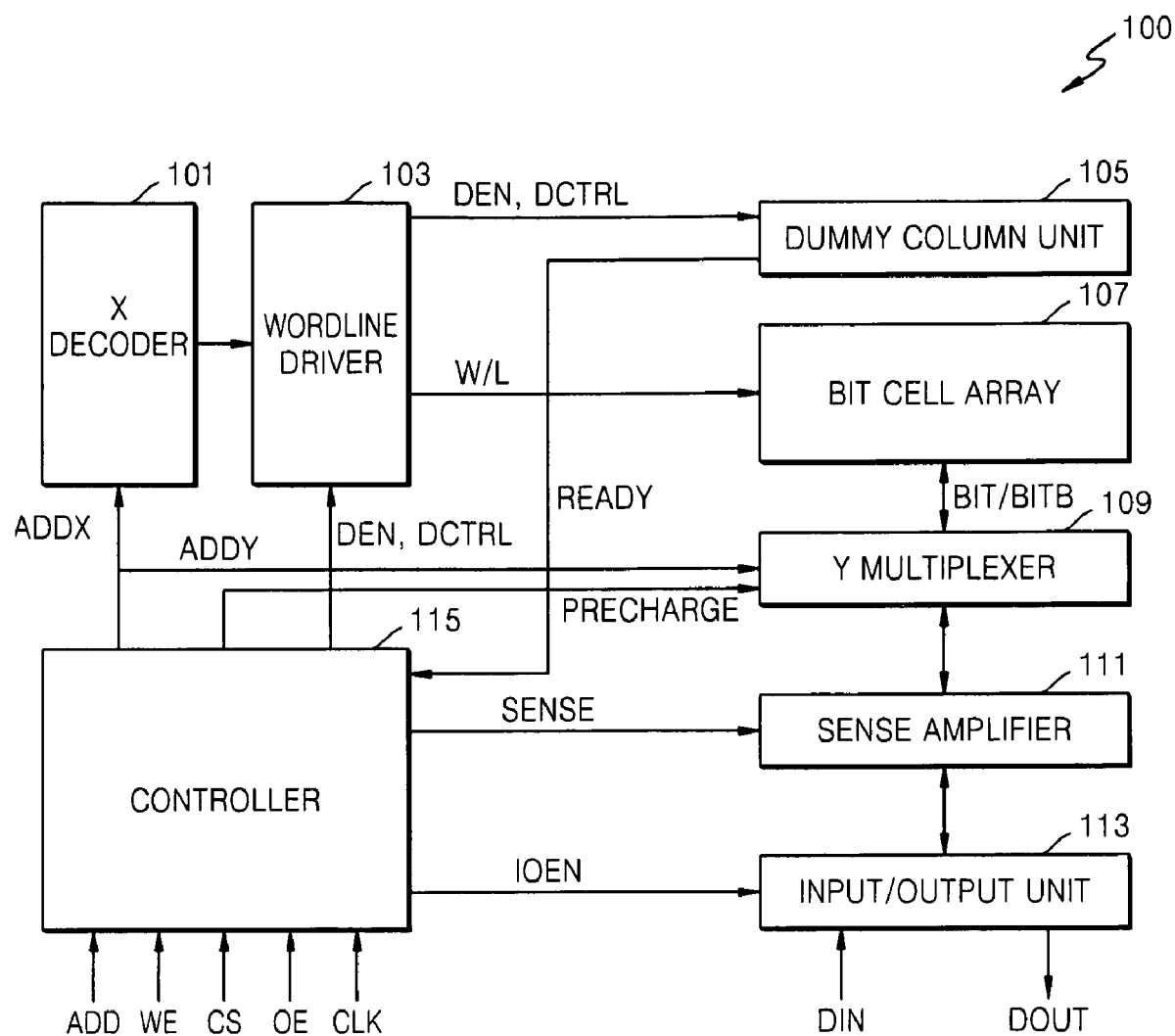
FIG. 1 is a block diagram of a conventional static random access memory (SRAM).
Figure 2:
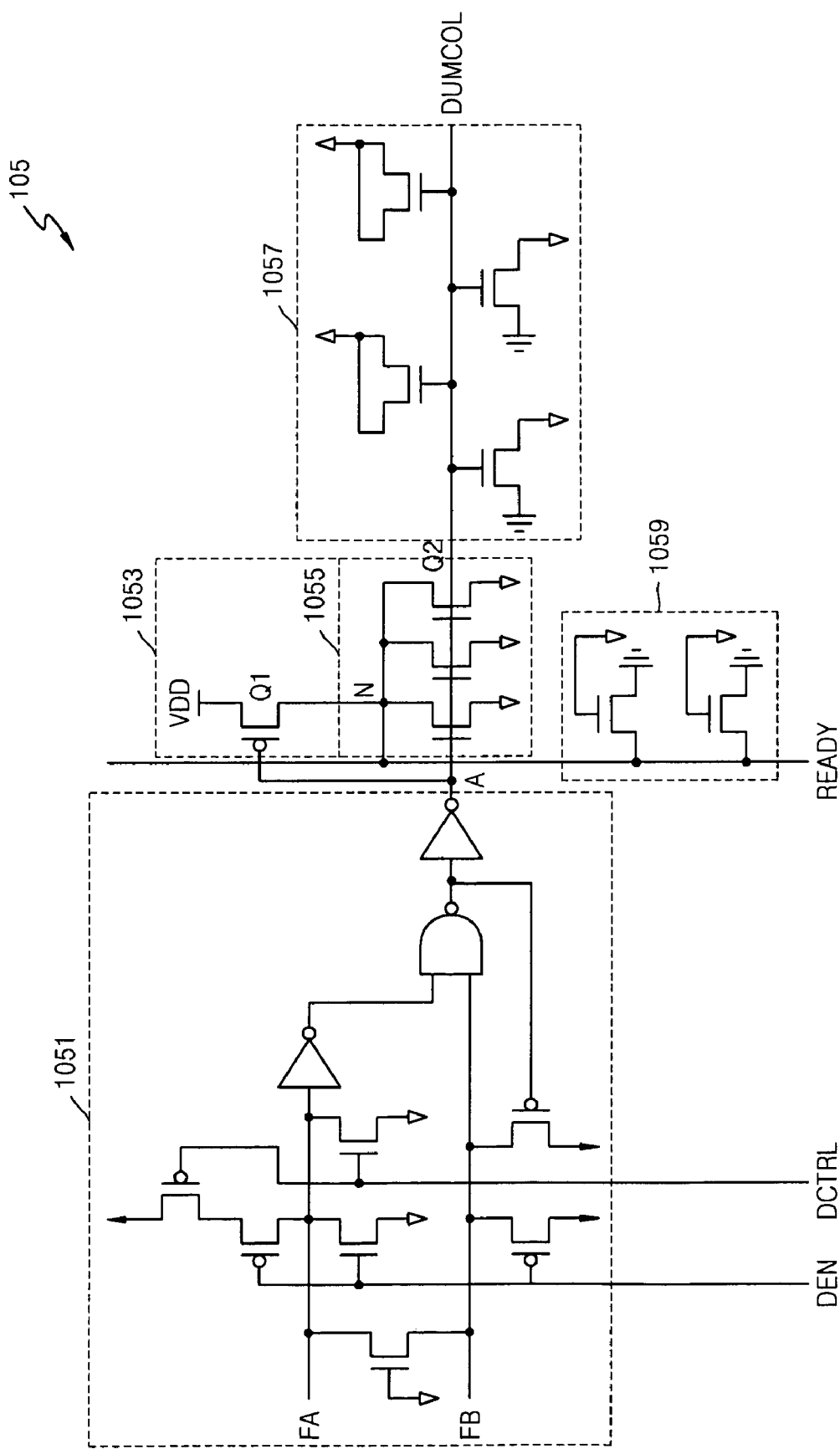
FIG. 2 is a block diagram of the dummy column unit of FIG. 1.
Figure 3:
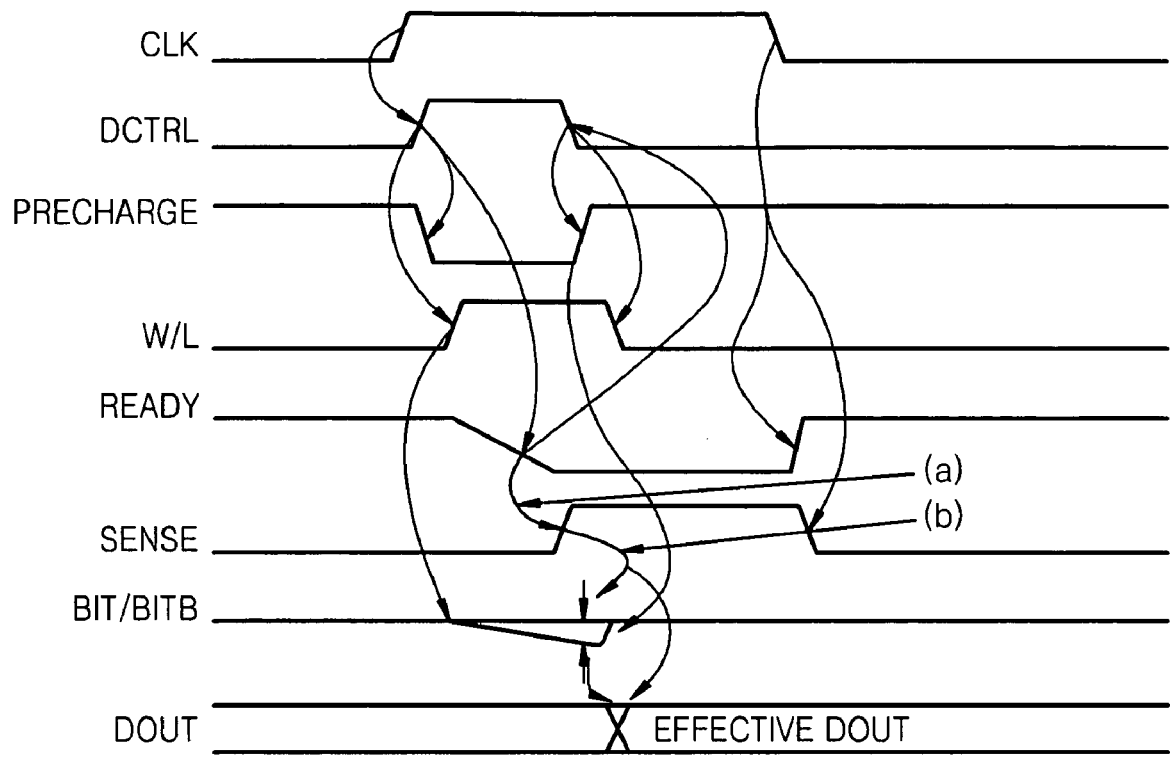
FIG. 3 illustrates a waveform timing diagram during a conventional read operation of the SRAM of FIG. 1.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As will be discussed below in greater detail with respect to example embodiments of the present invention, a sensing margin of a defective SRAM may be adjusted to repair a die via a fuse and failure analysis performed with an external pad. Thereby, the defective SRAM may be repaired, and need not be characterized as a "failure".

Figure 4:
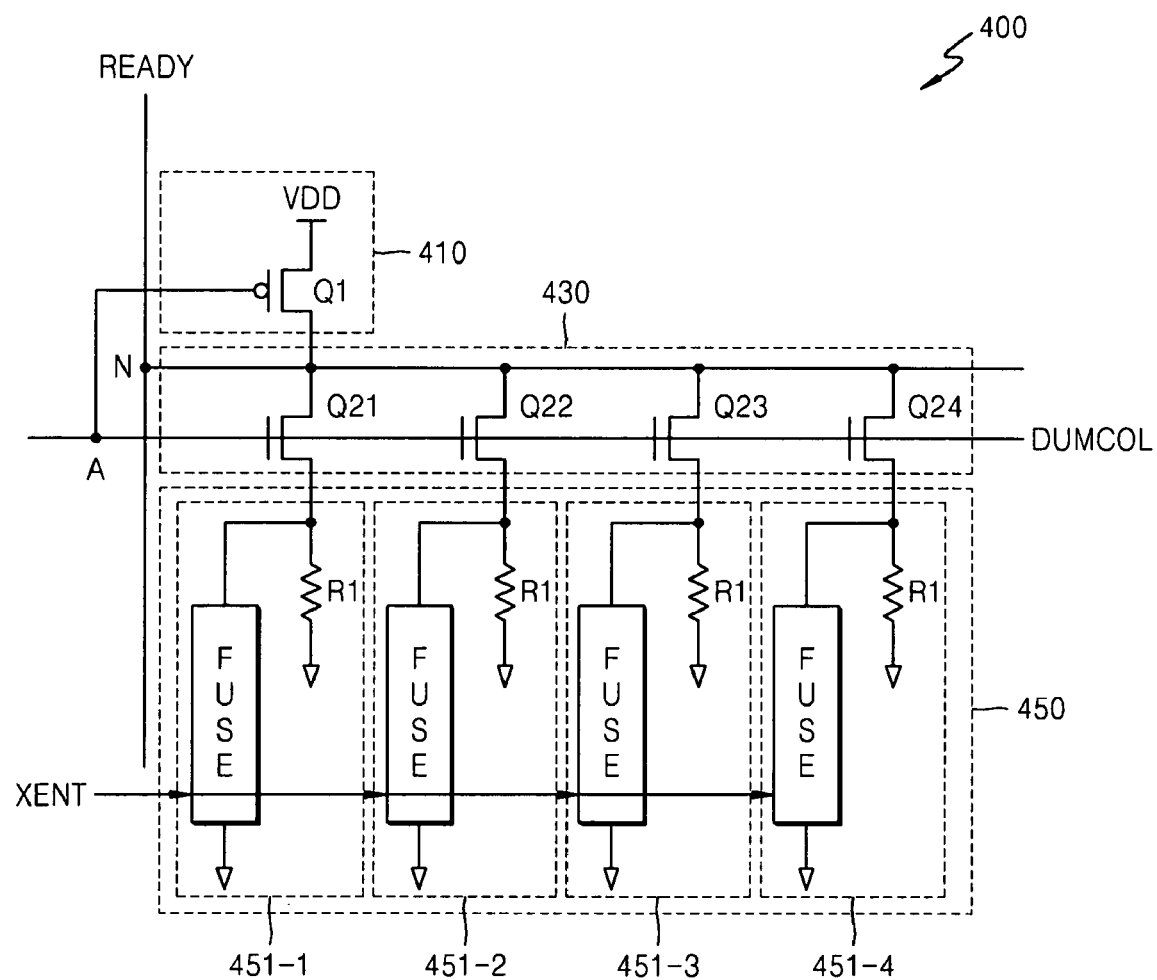
FIG. 4 is a block diagram of a sensing margin varying circuit according to an example embodiment of the present invention.

FIG. 4 is a block diagram of a sensing margin varying circuit 400 according to an example embodiment of the present invention. In the example embodiment of FIG. 4, the sensing margin varying circuit 400 may include a pull-up unit 410, an accelerating unit 430 and a sensing margin controller 450. The sensing margin varying circuit 400 may control a skew of a ready signal READY so as to control a sensing margin, which may correspond to a period from the output of a bit pair from a bit cell array (not shown) of a semiconductor memory device (not shown) to a sensing of the bit pair. Operation for controlling or adjusting the sensing margin may be performed by the sensing margin controller 450. As described above, the sensing margin may be affected by the "gradient" or skew of the ready signal READY (e.g., a duration of a transition from a first logic level, such as a higher logic level or logic "1", to a second logic level, such as a lower logic level or logic "0"). The skew of the ready signal READY during the transition from the first logic level to the second logic level may be based upon a rate or "velocity" of current flow from a node N to a ground voltage in the accelerating unit 430. Thus, the sensing margin controller 450 may control the velocity of the current.

Example configuration and operation of the sensing margin varying circuit 400 will now be described in greater detail with respect to the example embodiment of FIG. 4.

In the example embodiment of FIG. 4, the pull-up unit 410 may include a PMOS transistor Q1, connected between a power supply voltage VDD and the node N, which may turned on in response to a dummy column signal DUMCOL. The pull-up unit 410 may pull up the node N, through which the ready signal READY is output, if the dummy column signal DUMCOL is set to the second logic level (e.g., a lower logic level or logic "0").

In the example embodiment of FIG. 4, the accelerating unit 430 may be connected between the node N from which the ready signal READY is output and the sensing margin controller 450. The accelerating unit 430 may include a plurality of accelerating transistors Q21, Q22, Q23 and Q24 which may selectively be turned on in response to the dummy column signal DUMCOL. For example, the plurality of accelerating transistors Q21, Q22, Q23 and Q24 may be turned on if the dummy column signal DUMCOL is set to the first logic level (e.g., a higher logic level or logic "1") such that current flow may flow from the node N to the ground voltage.

In the example embodiment of FIG. 4, the sensing margin controller 450 may include a plurality of fuse units 451-1, 451-2, 451-3 and 451-4 connected to the plurality of accelerating transistors Q21, Q22, Q23 and Q24, respectively. Each of the plurality of fuse units 451-1, 451-2, 451-3 and 451-4 may include a fuse FUSE and a resistor R1 connected in parallel with each other.

In the example embodiment of FIG. 4, the sensing margin controller 450 may cut the fuse of at least one of the plurality of fuse units 451-1, 451-2, 451-3 and 451-4 in response to an external signal XENT to control the driving capability of the plurality of accelerating transistors Q21, Q22, Q23 and Q24. For example, if the fuse of a given fuse unit is cut, the current flowing from the node N to the ground voltage may flow through the resistor R1 of the corresponding fuse unit. Thus, the driving capability of an accelerating transistor connected to the fuse unit having the cut fuse may be reduced, but the driving capability of accelerating transistors connected to fuse units having fuses that are not cut may not be reduced. Thus, the gradient or skew of the ready signal READY (e.g., during a transition from the first logic level to the second logic level) may be controlled by cutting one or more fuses to control the driving capability of the plurality of accelerating transistors Q21, Q22, Q23 and Q24. For example, the gradient of the ready signal READY may be lowered by reducing the driving capability of the accelerating transistors Q21, Q22, Q23 and Q24. Thus, in an example, if the sensing margin of a semiconductor memory device produced based on a higher-speed lower-voltage design includes an insufficient sensing margin or a semiconductor memory device needs to be otherwise adjusted, the sensing margin may be increased by adjusting (e.g., lowering or reducing) the gradient of the ready signal READY.

Figure 5:
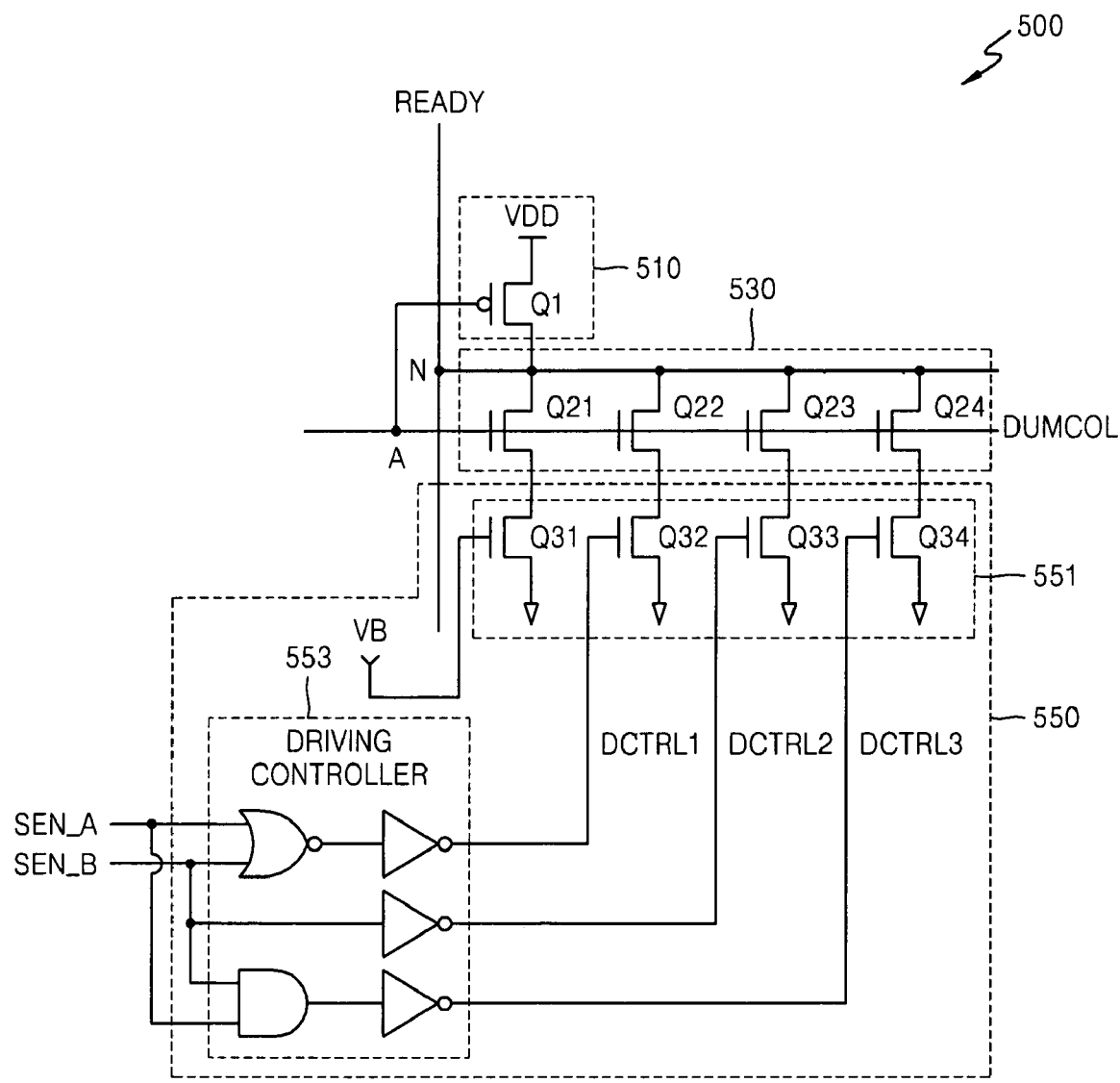
FIG. 5 is a block diagram of a sensing margin varying circuit according to another example embodiment of the present invention.

FIG. 5 is a block diagram of a sensing margin varying circuit 500 according to another example embodiment of the present invention. In the example embodiment of FIG. 5, the sensing margin varying circuit 500 may include a pull-up unit 510, an accelerating unit 530, a sensing margin controller 550 and a driving unit 551. The configuration and operation of the pull-up unit 510 and the accelerating unit 530 may be the same as that of the pull-up unit 410 and the accelerating unit 430, respectively, of the sensing margin varying circuit 400 of FIG. 4. Thus, hereinafter only example operation of the sensing margin controller 550 will be described (e.g., and not the "redundant" elements) for the sake of brevity.

In the example embodiment of FIG. 5, the sensing margin controller 550 may turn off one or more of a plurality of driving transistors Q31, Q32, Q33 and Q34 in response to external signals SEN_A and SEN_B so as to control the driving capability of the plurality of accelerating transistors Q21, Q22, Q23 and Q24, respectively. In an example, the external signals SEN_A and SEN_B may be input via external input pins.

In the example embodiment of FIG. 5, the sensing margin controller 550 may include the driving unit 551 having a plurality of driving transistors Q31, Q32, Q33 and Q34 connected to the plurality of accelerating transistors Q21, Q22, Q23 and Q24, respectively. The sensing margin controller 550 may further include a driving controller 553 outputting driving control signals DCTRL1, DCTRL2 and DCTRL3 for controlling whether one or more of the plurality of driving transistors Q31, Q32, Q33 and Q34 of the driving unit 551 may be turned off. In an example, the driving controller 553 may include a given logic circuit and may control the turning off of the plurality of driving transistors Q31, Q32, Q33 and Q34 based on the external signals SEN_A and SEN_B.

In the example embodiment of FIG. 5, while FIG. 5 is illustrated and above-described as including two external signals SEN_A and SEN_B used to control four driving transistors Q31, Q32, Q33 and Q34, it will be appreciated by one of ordinary skill in the art may not be limited to such numbers of driving transistors and external signals. For example, in another example embodiment of the present invention, three external signals may be used to control eight driving transistors (e.g., because $2^3$ equals 8), and so on.

Example operation of the sensing margin controller 550 including the driving unit 551 and the driving controller 553 will now be described in greater detail with respect to the example embodiment of FIG. 5.

In example operation of the sensing margin controller 550 of FIG. 5, the driving transistor Q31 may be turned on during an entirety of operation (e.g., or at least so long as the given bias voltage VB remains above a voltage threshold) because a gate of the driving transistor Q31 may be connected to a given bias voltage VB. Thus, the driving capability of the accelerating transistors Q21, Q22, Q23 and Q24 may be controlled by adjusting a number of driving transistors Q32, Q33 and Q34 which are turned on in response to the external signals SEN_A and SEN_B. For example, the driving capability of the accelerating transistors Q21, Q22, Q23 and Q24 may be reduced as a greater number of driving transistors are turned off, thereby increasing the sensing margin.

In example operation of the sensing margin controller 550 of FIG. 5, each of the driving transistors Q31, Q32, Q33 and Q34 may be turned on if the external signals SEN_A and SEN_B are each set to the first logic level (e.g., a higher logic level or logic "1"), and a higher (e.g., "highest", at least relative to other logic level settings of the external signals SEN_A and SEN_B) driving capability of the accelerating transistors Q21, Q22, Q23 and Q24 may be obtained. In another example, three of the four driving transistors Q31, Q32, Q33 and Q34 may be turned on if the external signals SEN_A and SEN_B are set to the first logic level and the second logic level, respectively. In another example, two of the four driving transistors Q31, Q32, Q33 and Q34 may be turned on if the external signals SEN_A and SEN_B are set to the second logic level and the first logic level, respectively. In another example, one of the four driving transistors Q31, Q32, Q33 and Q34 may be turned on if the external signals SEN_A and SEN_B are each set to the second logic level. Thus, in summary of the above-described examples, the number of "turned on" transistors may be 4, 3, 2 and 1 if the logic levels of the external signals SEN_A and SEN_B are (1,1), (1,0), (0,1) and (0,0), respectively.

In the example embodiment of FIG. 5, the driving capability of the accelerating unit 530 may be increased if the external signals SEN_A and SEN_B having logic value combinations of (0,0), (0,1), (1,0) and (1,1) are successively applied to the driving controller 553. Thus, an amount of current flowing from the node N to the ground voltage and the skew of the ready signal READY may be increased, thereby reducing the sensing margin. In this manner, the skew of the ready signal READY may be controlled by turning off, or leaving on, a selected number of driving transistors so as to adjust an amount of current flowing from the node N to the ground voltage through the accelerating transistors Q21, Q22, Q23 and Q24. In other words, turning off a selected number of the plurality of driving transistors Q31, Q32, Q33 and Q34 may be controlled so as to adjust an amount of current flowing from the node N to the ground voltage, thereby controlling the gradient of the ready signal READY (e.g., so as to be "lower" or more "gentle").

While above-described example embodiments of the present invention describe the sensing margin varying circuit as including the pull-up unit, the accelerating unit and the sensing margin controller, it will be appreciated that the sensing margin controller may alternatively be employed separate from the sensing margin varying circuit.

In another example embodiment of the present invention, a sensing margin varying circuit may control or adjust a skew of the ready signal so as to control the sensing margin, which may correspond to a period from the output of a bit pair from a bit cell array of a semiconductor memory device to the sensing of the bit pair. The sensing margin varying circuit may include a plurality of fuse units each connected to respective members of a plurality of accelerating transistors. Each of the fuse units may include a fuse and a resistor connected to each other in parallel. In an example, the sensing margin may be controlled by selectively cutting the fuse of at least one fuse unit in response to one or more external signals.

In another example embodiment of the present invention, a sensing margin varying circuit may include a plurality of driving transistors and a driving controller. The plurality of driving transistors may be respectively connected to a plurality of accelerating transistors outputting the ready signal. The driving controller may output driving control signals controlling which of the plurality of driving transistors may be turned off in response to one or more external signals. In an example, the sensing margin may be controlled by adjusting which of the plurality of driving transistors may be turned off in response to the one or more external signals.

In another example embodiment of the present invention, if the sensing margin controller is independent from a sensing margin varying circuit, the sensing margin varying circuit may be included within a semiconductor memory device so as to control the sensing margin of the semiconductor memory device. The semiconductor memory device may include a dummy column unit, a controller, a sense amplifier and a sensing margin controller. The dummy column unit may output a ready signal in response to a data enable signal and a data control signal. The controller may output a sensing enable signal in response to the ready signal. The sense amplifier may sense a bit pair output from a bit cell array in response to the sensing enable signal. The sensing margin controller may control the skew of the ready signal to control the sensing margin from the output of the bit pair to the sensing the bit pair.

In another example embodiment of the present invention, a sensing margin varying circuit may control a sensing margin or speed of an SRAM (e.g., if the SRAM has an insufficient sensing margin or a lower speed because of a variation in a fine process or a higher-speed lower-voltage design for manufacturing the SRAM). Furthermore, the sensing margin varying circuit may adjust the sensing margin by cutting one or more fuses (e.g., based on one or more external signals) during a debugging process of the SRAM, thereby allowing SRAMs with inadequate sensing margins to be repaired as opposed to simply being labeled as "failures".

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Further, while example embodiments of the present invention have been above-described as generally directed to SRAMs, it will be appreciated that other example embodiments of the present invention may be directed to any type of semiconductor memory device.

Such variations are not to be regarded as a departure from the spirit and scope of example embodiments of the present invention, and all such modifications as would be obvious to one skilled in the art are intended to be included within the scope of the following claims.

What is claimed is:

1. A sensing margin varying circuit which controls the skew of a ready signal, comprising:
    a sensing margin controller including a plurality of semiconductor elements, each of the plurality of semiconductor elements including a fuse and a resistor which are connected to each other in parallel; and
    a plurality of accelerating transistors, each of the plurality of semiconductor elements individually connected to at least one of the plurality of accelerating transistors to form a current path between a node outputting the ready signal and a ground voltage,
    wherein the current path is formed by one of the fuse when the fuse is not cut and the resistor when the fuse is cut so as to control the driving capability of at least one of the plurality of accelerating transistors and adjust a duration of a logic transition of the ready signal.

2. A semiconductor memory device, comprising:
    the sensing margin varying circuit of claim 1;
    a dummy column unit outputting the ready signal for controlling a sensing margin, wherein the ready signal is output in response to a data enable signal and a data control signal which are enabled during a data read operation, the sensing margin corresponding to a period of time from an output of a bit pair from a bit cell array to a sensing of the bit pair;
    a controller outputting a sensing enable signal in response to the ready signal; and
    a sense amplifier sensing the bit pair output from the bit cell array in response to the sensing enable signal.

3. The semiconductor memory device of claim 2, wherein the dummy column unit includes:
    a switching controller outputting a dummy column signal in response to the data enable signal and the data control signal;
    a pull-up unit pulling up the node outputting the ready signal if the dummy column signal is set to a first logic level; and
    an accelerating unit including the plurality of accelerating transistors that are selectively turned on if the dummy column signal is set to a second logic level to form the current path from the node to the ground voltage.

4. The semiconductor memory device of claim 2, wherein the sensing margin controller selectively controls whether one or more of the plurality of fuses within the plurality of fuse units is cut based on an external signal.

5. The semiconductor memory device of claim 2, wherein the semiconductor memory device is an Static Random Access Memory (SRAM).

6. The sensing margin varying circuit of claim 1, comprising:
    a pull-up unit pulling up the node through which the ready signal is output if a dummy column signal is set to a first logic level;
    an accelerating unit including the plurality of accelerating transistors, one or more of the plurality of accelerating transistors being selectively turned on if the dummy column signal is set to a second logic level to form the current path from the node to the ground voltage; and
    wherein the dummy column signal is generated in response to a data enable signal and a data control signal that are enabled during a data read operation.

7. The sensing margin varying circuit of claim 6, wherein the sensing margin controller selectively controls whether one or more of the plurality of fuses within the plurality of fuse units is cut based on an external signal.

8. A sensing margin varying circuit which controls the skew of a ready signal, comprising:
    a sensing margin controller including a plurality of semiconductor elements, the plurality of semiconductor elements including a plurality of driving transistors;
    a plurality of accelerating transistors, each of the plurality of semiconductor elements individually connected to at least one of the plurality of accelerating transistors to form a current path between a node outputting the ready signal and a ground voltage, the driving capability of at least one of the plurality of accelerating transistors individually controlled by the sensing margin controller so as to adjust a duration of a logic transition of the ready signal; and
    a driving controller outputting a driving control signal controlling whether one or more of the plurality of driving transistors is turned off in response to an external signal.

9. The sensing margin varying circuit of claim 1, wherein the sensing margin varying circuit selectively controls whether one or more of the plurality of fuses within the plurality of fuse units is cut based on an external signal.

10. The sensing margin varying circuit of claim 8, wherein the external signal is received through an external input pin.

11. The sensing margin varying circuit of claim 10, wherein a sensing margin is controlled by controlling which of the plurality of driving transistors is turned off in response to the external signal.

12. A method of controlling the skew of a ready signal, comprising:
    individually controlling the driving capability of at least one of a plurality of accelerating transistors so as to adjust a duration of a logic transition of the ready signal, each of the plurality of accelerating transistors individually connected to at least one of a plurality of semiconductor elements to form a current path between a node outputting the ready signal and a ground voltage, each of the plurality of semiconductor elements including a fuse and a resistor which are connected to each other in parallel,
    wherein the current path is formed by one of the fuse if the fuse is not cut and the resistor if the fuse is cut.

13. The method of claim 12, wherein individually controlling the plurality of accelerating transistors includes sending one or more control signals to adjust which of the plurality of accelerating transistors are turned on and which of the plurality of accelerating transistors are turned off.

14. A sensing margin varying circuit performing the method of claim 12.

15. The method of claim 12, wherein individually controlling the plurality of accelerating transistors includes sending one or more control signals to individually adjust the driving capability of the plurality of accelerating transistors.

16. The sensing margin varying circuit of claim 8, wherein the sensing margin controller selectively controls whether one or more of the plurality of driving transistors is turned off based on the external signal.

* * * * *